（12）United States Patent
Tenmyo et al.

(10) Patent No.: US 10,838,013 B2
(45) Date of Patent: Nov. 17, 2020

(54) MANAGEMENT APPARATUS AND POWER STORAGE SYSTEM

(71) Applicant: Panasonic Intellectual Property Management Co., Ltd., Osaka (JP)

(72) Inventors: Hiroshi Tenmyo, Osaka (JP); Shinichi Yuasa, Kyoto (JP); Tomokazu Sada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 117 days.

(21) Appl. No.: 16/218,536

(22) Filed: Dec. 13, 2018

(65) Prior Publication Data

US 2019/0113580 A1 Apr. 18, 2019

Related U.S. Application Data

(63) Continuation of application No. PCT/JP2017/014735, filed on Apr. 11, 2017.

(30) Foreign Application Priority Data

Jun. 16, 2016 (JP) ................................. 2016-120043

(51) Int. Cl.
 *H02J 7/00* (2006.01)
 *G01R 31/3842* (2019.01)
 (Continued)

(52) U.S. Cl.
 CPC ....... *G01R 31/3842* (2019.01); *G01R 31/388* (2019.01); *G01R 31/392* (2019.01);
 (Continued)

(58) Field of Classification Search
 CPC ............. G01R 31/3842; G01R 31/392; G01R 31/388; G01R 31/50; G01R 31/52;
 (Continued)

(56) References Cited

U.S. PATENT DOCUMENTS

2009/0155674 A1 6/2009 Ikeuchi et al.
2014/0184235 A1 7/2014 Ikeuchi et al.
 (Continued)

FOREIGN PATENT DOCUMENTS

| CN | 101465449 A | 6/2009 |
| JP | 2000-092732 | 3/2000 |
| JP | 2014-112093 | 6/2014 |

OTHER PUBLICATIONS

International Search Report of PCT application No. PCT/JP2017/014735 dated Jul. 4, 2017.
 (Continued)

*Primary Examiner* — Zixuan Zhou
(74) *Attorney, Agent, or Firm* — McDermott Will & Emery LLP

(57) ABSTRACT

A voltage detection unit detects voltage between both ends of a power storage unit. A current detection unit detects current flowing through the power storage unit. A control unit estimates a state of charge (SOC) of the power storage unit using an open circuit voltage (OCV) method based on the voltage detected by the voltage detection unit and estimates the SOC of the power storage unit using a current integration method based on the current detected by the current detection unit. The control unit compares the SOC estimated using the OCV method with the SOC estimated using the current integration method to determine whether micro short circuit occurs in the power storage unit.

4 Claims, 7 Drawing Sheets

(51) Int. Cl.
*H01M 10/48* (2006.01)
*H01M 10/42* (2006.01)
*G01R 31/392* (2019.01)
*G01R 31/388* (2019.01)
*H01M 10/44* (2006.01)
*G01R 31/50* (2020.01)
*H01M 10/0525* (2010.01)

(52) U.S. Cl.
CPC ......... *H01M 10/42* (2013.01); *H01M 10/441* (2013.01); *H01M 10/443* (2013.01); *H01M 10/48* (2013.01); *H02J 7/007* (2013.01); *G01R 31/50* (2020.01); *H01M 10/0525* (2013.01)

(58) Field of Classification Search
CPC ....... H01M 2010/4271; H01M 10/482; H01M 10/42; H01M 10/441; H01M 10/443; H01M 10/48; H01M 10/0525; H02J 7/007

USPC ....................................................... 320/132
See application file for complete search history.

(56) References Cited

U.S. PATENT DOCUMENTS

2016/0377667 A1* 12/2016 Friedrich ........... G01R 31/3842
324/434
2017/0254856 A1* 9/2017 Shiraishi .............. G01R 31/367

OTHER PUBLICATIONS

English Translation of Chinese Search Report dated May 22, 2020 for the related Chinese Patent Application No. 201780036598.1.

* cited by examiner

MANAGEMENT APPARATUS AND POWER STORAGE SYSTEM

TECHNICAL FIELD

The present invention relates to a management apparatus for managing a power storage unit and a power storage system.

BACKGROUND ART

Secondary batteries, such as lithium ion batteries and nickel hydride batteries, are used in various intended uses in recent years. For example, the secondary batteries are used in in-vehicle use for supplying electric power to traction motors of electric vehicles (EVs), hybrid electric vehicles (HEVs), and plug-in hybrid vehicles (PHVs), power storage use for backup, frequency regulation (FR) use for stabilizing the frequencies of systems, and so on.

In a secondary battery, such as a lithium ion battery, micro short circuit may occur in the battery because of contact between a positive electrode and a negative electrode due to a shift of a separator, an occurrence of a conductive path due to mixing of foreign matters into the battery, or the like. The micro short circuit may possibly cause overheat. When multiple batteries are connected in series to each other, the batteries are varied in voltage. Since current is excessively consumed in a battery in which the micro short circuit occurs, compared with other normal batteries that are connected in series to each other, a difference in potential occurs between the battery in which the micro short circuit occurs and the other normal batteries.

In addition, the secondary batteries are deteriorated with the increasing number of times of charge and discharge. If the deterioration occurs, full charge capacity is decreased and an increase in voltage during charge and a decrease in voltage during discharge are made fast. Accordingly, also when the batteries that are connected in series to each other are varied in the level of deterioration, the difference in potential occurs between the batteries. In particular, when old batteries and new batteries are mixed due to partial replacement of the batteries, the batteries are increasingly varied in the level of deterioration.

In general, in multiple lithium ion batteries that are connected in series to each other, the voltages of the respective batteries are measured and, if the batteries are varied in voltage, equalization control is performed (for example, refer to PTL 1).

CITATION LIST

Patent Literature

PTL 1: Japanese Published Unexamined Patent Application No. 2000-92732

SUMMARY OF INVENTION

Technical Problem

When the batteries that are connected in series to each other are varied in voltage, it is difficult to rapidly identify its cause. The variation in voltage may occur due to the variation in the level of deterioration of the batteries, due to measurement errors of detectors, due to the micro short circuit, or due to a combination of these factors. In particular, when the variation in the level of deterioration of the batteries and/or the measurement errors occur along with the micro short circuit, it is difficult to accurately determine whether the micro short circuit occurs from the difference in voltage between the multiple batteries.

In view of the above situation, it is an object of the present disclosure to provide a technology capable of determining whether the micro short circuit occurs with high accuracy.

Solution to Problem

In order to resolve the above problems, a management apparatus in one aspect of the present disclosure includes a voltage detection unit that detects voltage between both ends of a power storage unit, a current detection unit that detects current flowing through the power storage unit, and a control unit that determines whether micro short circuit occurs in the power storage unit. The control unit estimates a state of charge (SOC) of the power storage unit using an open circuit voltage (OCV) method based on the voltage detected by the voltage detection unit, estimates the SOC of the power storage unit using a current integration method based on the current detected by the current detection unit, and compares the SOC estimated using the OCV method with the SOC estimated using the current integration method to determine whether the micro short circuit occurs in the power storage unit.

An arbitrary combination of the above components and conversion of the representation of the present disclosure between methods, apparatus, systems, and so on are also effective as aspects of the present disclosure.

Advantageous Effects of Invention

According to the present disclosure, it is possible to determine whether the micro short circuit occurs with high accuracy.

DESCRIPTION OF EMBODIMENTS

Figure 1A:
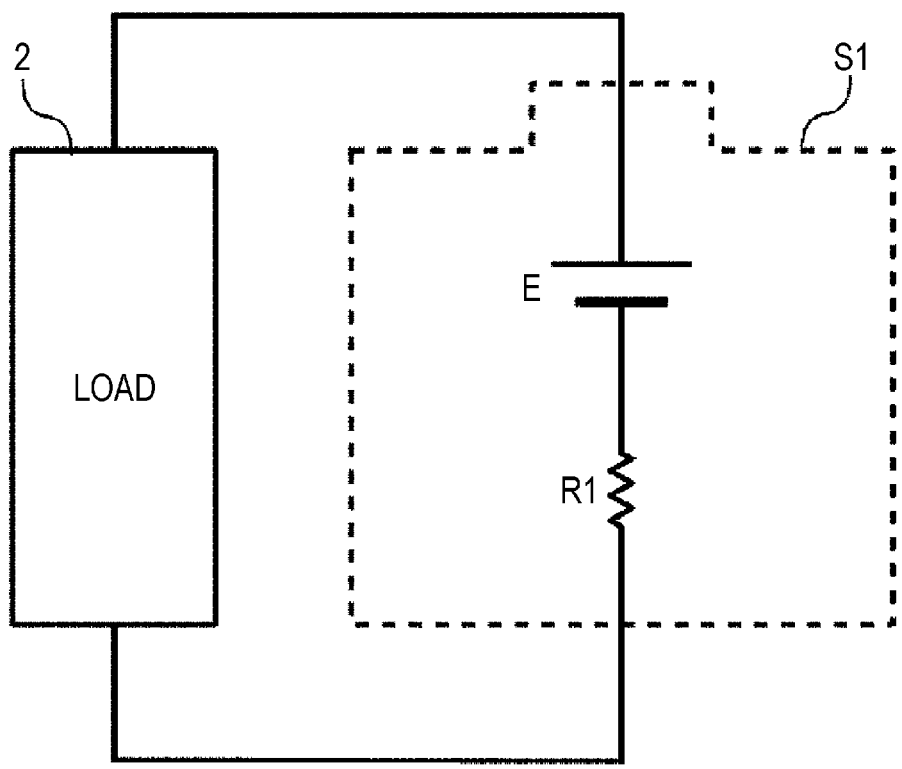
FIG. 1A is a diagram for describing a battery cell in a state in which micro short circuit does not occur.
Figure 1B:
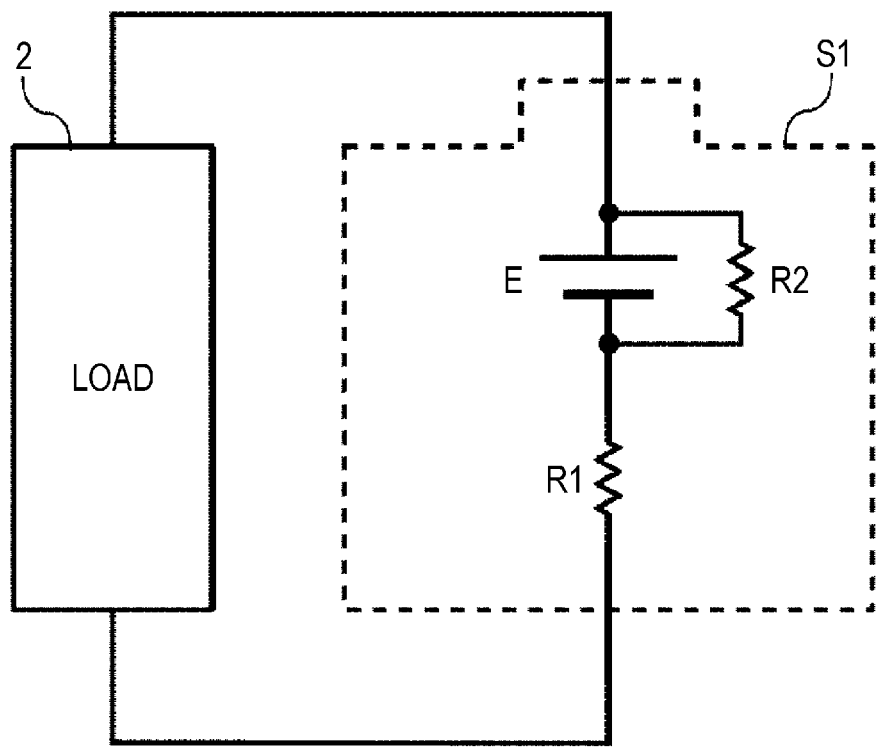
FIG. 1B is a diagram for describing the battery cell in a state in which the micro short circuit occurs.

FIG. 1A and FIG. 1B are diagrams for describing the micro short circuit. FIG. 1A illustrates a battery cell S1 in a state in which the micro short circuit does not occur and FIG. 1B illustrates the battery cell S1 in a state in which the micro short circuit occurs. The battery cell S1 includes an electromotive force unit E and an internal resistance R1. Both ends of the battery cell S1 are connected to both ends of a load 2.

As illustrated in FIG. 1B, the micro short circuit occurs at both ends of the electromotive force unit E in the battery cell S1. For example, when both ends of the electromotive force unit E are in contact with each other due to mixing of foreign matters, such as dust and dirt, the insulation between both ends of the electromotive force unit E is broken and both ends of the electromotive force unit E are in a conduction state via a micro short circuit resistance R2.

The micro short circuit occurs in the battery cell S1, unlike external short circuit in which both ends of the battery cell S1 are short-circuited. When the micro short circuit resistance R2 is small, large current flows with large heat. When the micro short circuit resistance R2 is large, the capacity of the battery cell S1 is gradually decreased with consumption of current by the micro short circuit resistance R2 although large current does not flow.

Figure 2:
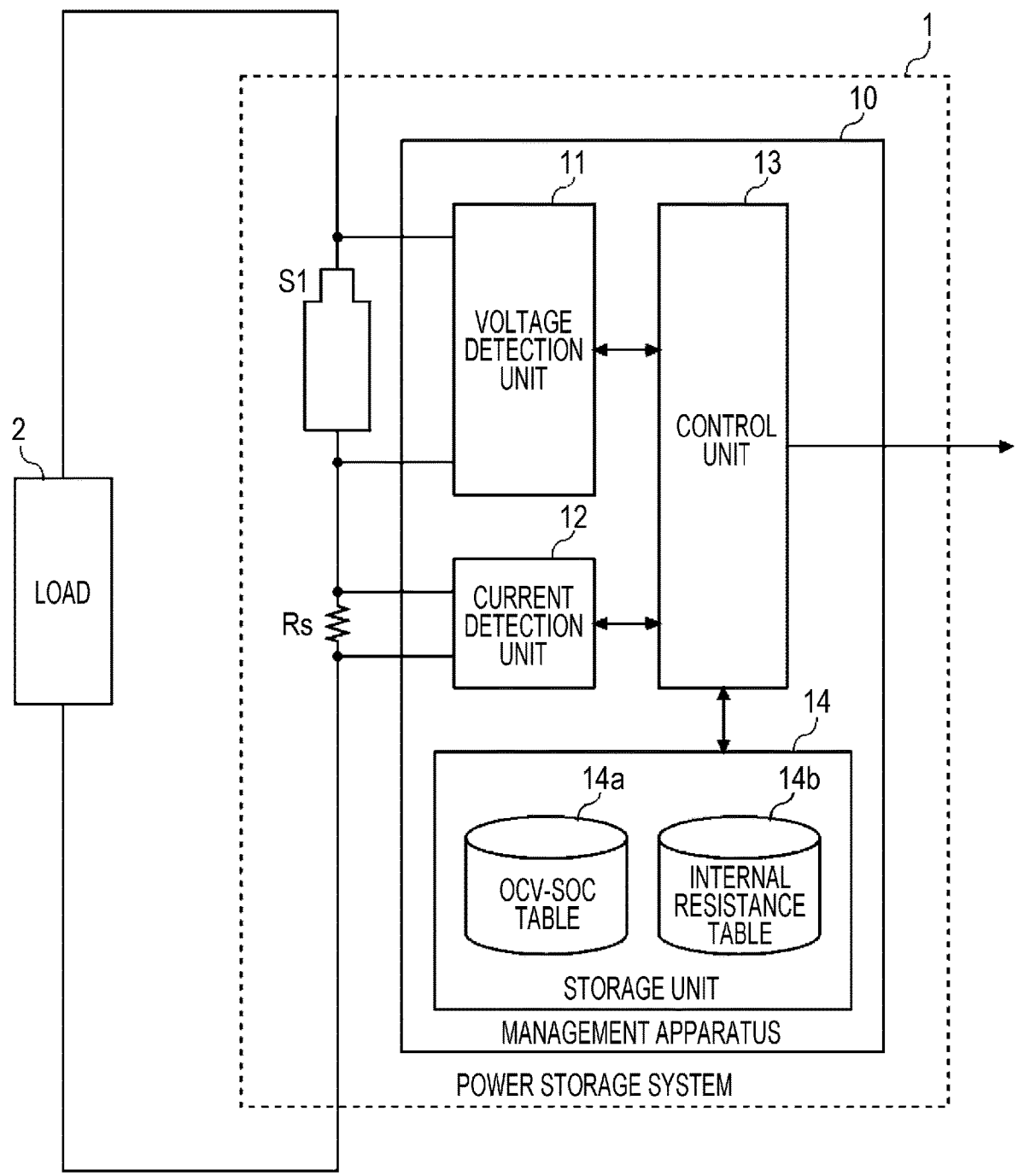
FIG. 2 is a diagram illustrating an exemplary configuration of a power storage system according to an embodiment of the present invention.

FIG. 2 is a diagram illustrating an exemplary configuration of a power storage system 1 according to an embodiment of the present invention. The power storage system 1 is connected to both ends of the load 2. In this description, the load 2 is a concept including a power supply, such as a power generator and a system. When the load 2 is an alternating-current load, an inverter (not illustrated) is provided between the power storage system 1 and the load 2. The inverter converts alternating-current power supplied from the load 2 into direct-current power to supply the direct-current power to the power storage system 1 and converts the direct-current power supplied from the power storage system 1 into the alternating-current power to supply the alternating-current power to the load 2.

The power storage system 1 includes the cell S1, a shunt resistor Rs, and a management apparatus 10. A lithium ion battery cell, a nickel hydride battery cell, an electric double layer capacitor cell, a lithium ion capacitor cell, or the like is capable of being used as the cell S1. An example in which the lithium ion battery cell (nominal voltage: 3.6 V to 3.7 V) is used as the cell S1 is assumed in this description.

The shunt resistor Rs is connected in series to the cell S1. The shunt resistor Rs functions as a current detection element. A Hall element may be used, instead of the shunt resistor Rs.

The management apparatus 10 includes a voltage detection unit 11, a current detection unit 12, a control unit 13, and a storage unit 14. The voltage detection unit 11 detects the voltage between both ends of the cell S1 and supplies the detected voltage to the control unit 13. The current detection unit 12 includes an error amplifier connected to both ends of the shunt resistor Rs. The error amplifier detects the voltage between both ends of the shunt resistor Rs. The current detection unit 12 detects the current flowing through the cell S1 based on the voltage between both ends of the shunt resistor Rs and supplies the detected current to the control unit 13.

The control unit 13 manages the cell S1 based on the voltage of the cell S1 detected by the voltage detection unit 11 and the current flowing through the cell S1 detected by the current detection unit 12. The configuration of the control unit 13 is capable of being realized through cooperation of hardware resources and software resources or only by the hardware resources. A microcomputer, a digital signal processor (DSP), a field programmable gate array (FPGA), and other large scale integration (LSI) circuits may be used as the hardware resources. Programs including firmware may be used as the software resources.

The storage unit 14 includes an open circuit voltage (OCV)-state of charge (SOC) table 14a and an internal resistance table 14b. The storage unit 14 is capable of being realized by a read only memory (ROM) and a random access memory (RAM).

The control unit 13 estimates the SOC of the cell S1 using an OCV method based on the voltage detected by the voltage detection unit 11. Stable relationship is established between the SOC and the OCV in the lithium ion battery. Accordingly, measurement of the OCV of the cell S1 enables the SOC of the cell S1 to be estimated. A designer registers the OCV-SOC table 14a in which OCV-SOC characteristics of the cell S1 are defined in the storage unit 14. The control unit 13 refers to the OCV-SOC table 14a to estimate the SOC based on the voltage detected by the voltage detection unit 11.

Since open circuit voltage is used in the OCV method, it is necessary to correct the voltage detected by the voltage detection unit 11 in a state in which the current flows through the cell S1 (during charge and discharge). During the charge and discharge, closed circuit voltage (CCV) is converted into the open circuit voltage (OCV) using Equation (1).

$$OCV = CCV \pm I \times R \qquad \text{Equation (1)}$$

CCV: the value of voltage detected by the voltage detection unit 11

I: the value of current detected by the current detection unit 12

R: internal resistance

The internal resistance of the lithium ion battery is not constant and is varied depending on the situation. The internal resistance of the lithium ion battery is mainly affected by the temperature, the SOC, the current, and a state of health (SOH). Specifically, the internal resistance of the lithium ion battery is increased when the temperature is low, when the SOC is low, when the current is large, and when the deterioration is advanced. The designer creates the internal resistance table 14b in which at least one of the temperature, the SOC, the current, and the state of health is used as an input parameter and the internal resistance is used as an output parameter and registers the created internal resistance table 14b in the storage unit 14. The internal resistance table 14b is created based on values derived from an experiment or a simulation.

When the temperature is adopted as the input parameter, it is necessary to provide a temperature sensor (for example, a thermistor) near the cell S1 and the temperature sensor supplies the detected temperature to the control unit 13.

Figure 3:
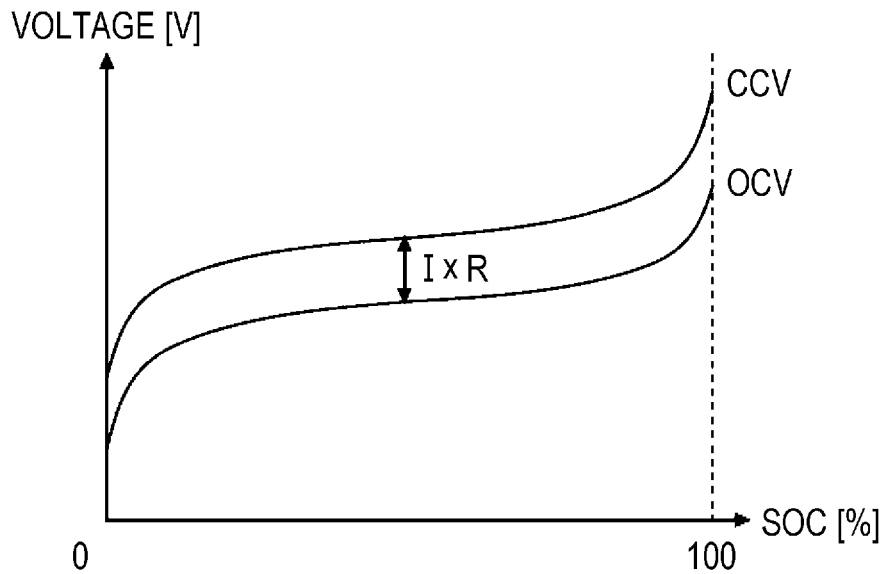
FIG. 3 is a graph illustrating the relationship between OCV and CCV during charge of the cell.

FIG. 3 is a graph illustrating the relationship between the OCV and the CCV during the charge of the cell S1. During the charge, the CCV is calculated by adding I×R to the OCV. In contrast, during the discharge, the CCV is calculated by subtracting I×R from the OCV.

The control unit 13 estimates the SOC of the cell S1 using the OCV method and estimates the SOC of the cell S1 using a current integration method based on the current detected by the current detection unit 12. Specifically, the control unit 13 varies the SOC in accordance with the value of current detected by the current detection unit 12 based on an initial SOC. Here, the charge current is set to a positive value and the discharge current is set to a negative value.

The SOC estimated using the OCV method is hereinafter referred to as SOC-V and the SOC estimated using the current integration method is hereinafter referred to as SOC-I. Although a slight arithmetic error occurs because the SOC-V is different from the SOC-I in the arithmetic algorithm, the value of the SOC-V is equal to the value of the SOC-I if other conditions are ideal conditions. Practically, the value of the SOC-V and the value of the SOC-I are affected by measurement errors in the voltage detection unit 11, the current detection unit 12, and the temperature sensor (not illustrated). The arithmetic error caused by the estimation algorithm of the SOC and the measurement errors in the various detectors are disregarded for clarity of the description in this description.

Since the consumption of current occurs in the cell S1 if the micro short circuit occurs in the cell S1, the SOC of the cell S1 is gradually decreased. The influence of the decrease in voltage is constantly reflected in the SOC-V. In contrast, the influence of the decrease in voltage is reflected only in the initial value of the SOC-I and is not reflected in the subsequent values of the SOC-I. Accordingly, although the value of the SOC-V is equal to the value of the SOC-I in the initial state, the value of the SOC-V is made lower than the value of the SOC-I with time and the gap between the value of the SOC-V and the value of the SOC-I is increased. Consequently, the control unit 13 is capable of determining whether the micro short circuit occurs by comparing the SOC-V with the SOC-I.

Figure 4:
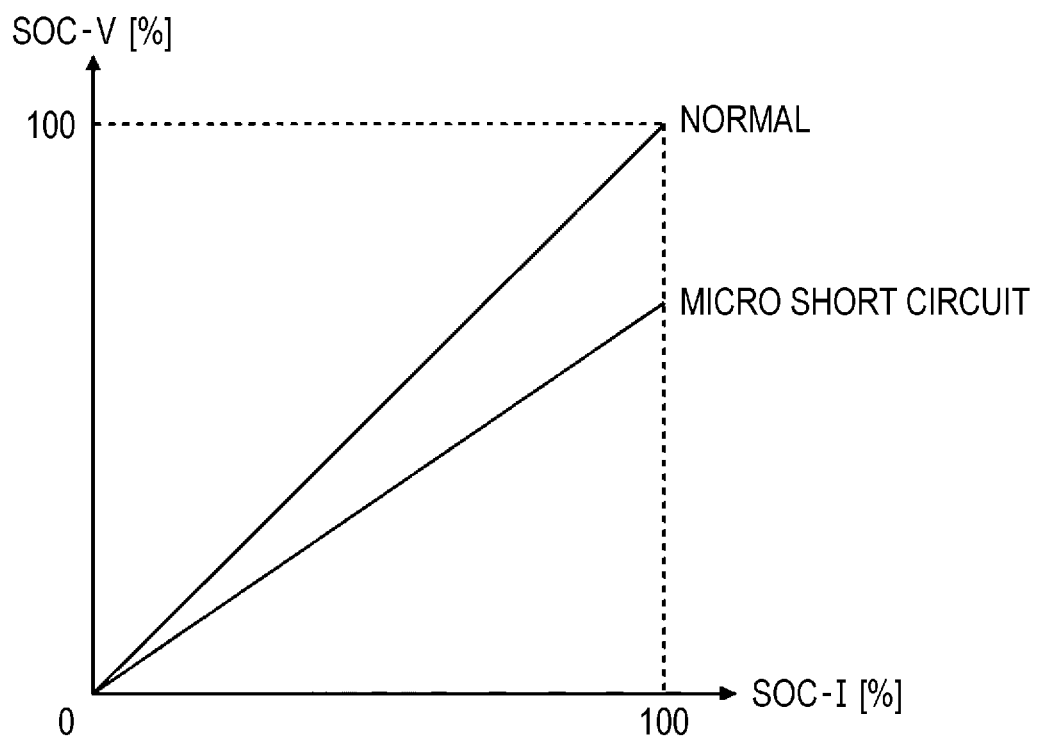
FIG. 4 is a graph illustrating the relationship between SOC-V and SOC-I of a normal cell and the relationship between the SOC-V and the SOC-I of a cell in which the micro short circuit occurs.

FIG. 4 is a graph illustrating the relationship between the SOC-V and the SOC-I of the normal cell S1 and the relationship between the SOC-V and the SOC-I of the cell S1 in which the micro short circuit occurs. In the case of the normal cell S1, the value of the SOC-V is equal to the value of the SOC-I. In contrast, in the case of the cell S1 in which the micro short circuit occurs, the value of the SOC-V is lower than the value of the SOC-I.

Figure 5:
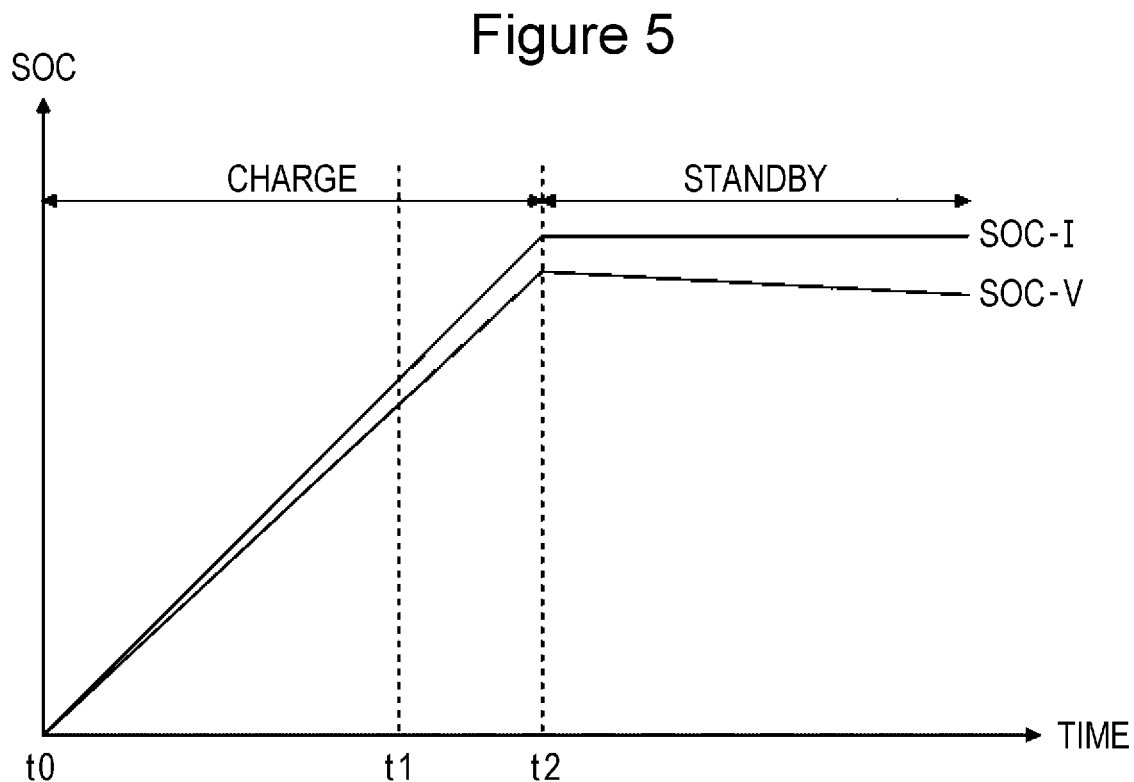
FIG. 5 is a graph illustrating a first estimation example of the SOC-V and the SOC-I of the cell in which the micro short circuit occurs.

FIG. 5 is a graph illustrating a first estimation example of the SOC-V and the SOC-I of the cell S1 in which the micro short circuit occurs. The first estimation example is an example in which the SOC of the cell S1 becomes zero during stop of the cell S1 because of the consumption of current due to the micro short circuit and the SOC in the initial state is zero. After activation of the load 2, the charge into the cell S1 is started and the SOC of the cell S1 is gradually increased. In comparison between the SOC-V and the SOC-I, since the SOC-I is a value in which the consumption of current due to the micro short circuit is not reflected, the value of the SOC-I is constantly higher than the value of the SOC-V. In addition, the difference between the SOC-I and the SOC-V is increased with time.

Figure 6:
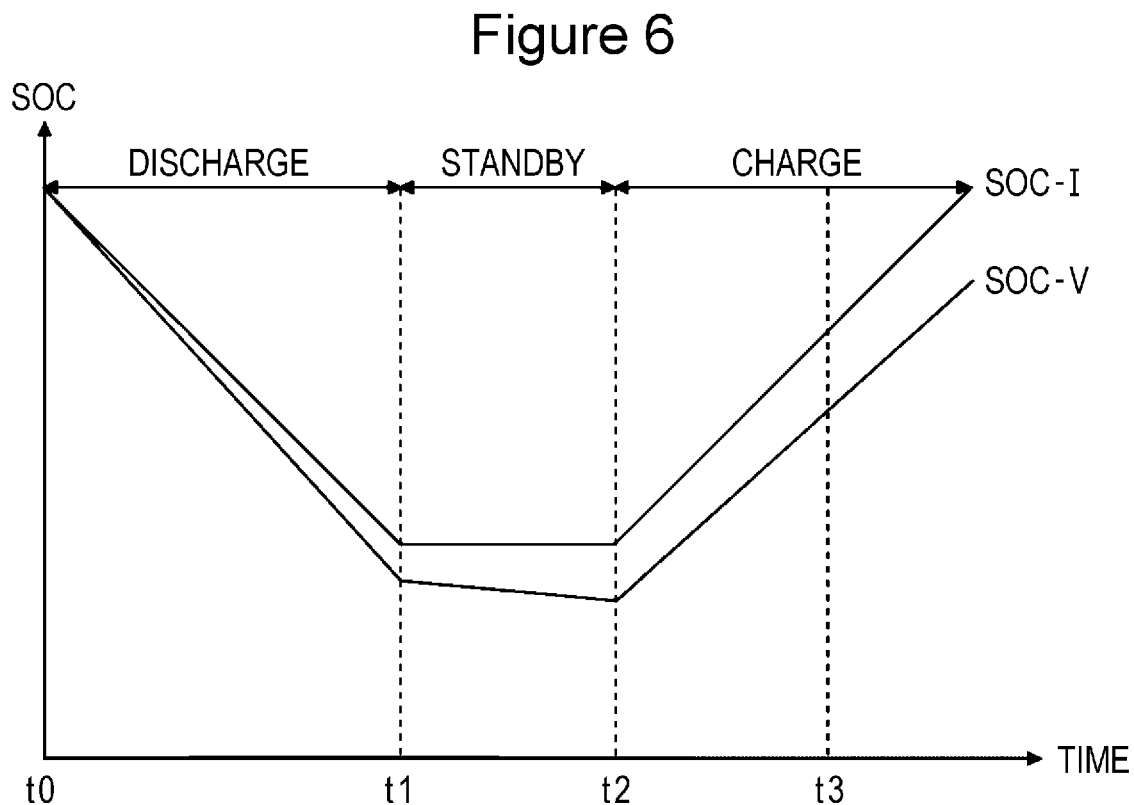
FIG. 6 is a graph illustrating a second estimation example of the SOC-V and the SOC-I of the cell in which the micro short circuit occurs.

FIG. 6 is a graph illustrating a second estimation example of the SOC-V and the SOC-I of the cell S1 in which the micro short circuit occurs. The second estimation example is an example in which the consumption of current due to the micro short circuit is small or only a short time elapses since the previous stop and in which the SOC in the initial state is high. In the second estimation example, after the activation of the load 2, the discharge from the cell S1 to the load 2 is performed and the charge from the load 2 to the cell S1 is performed with a standby period interposed between the discharge and the charge. Also when the charge and discharge irregularly occur, as in the second estimation example, the value of the SOC-I is constantly higher than the value of the SOC-V. In addition, the difference between the SOC-I and the SOC-V is increased with time.

Accordingly, it is determined in theory that the micro short circuit occurs in the cell S1 if the relationship of SOC-I>SOC-V is established. However, practically, the arithmetic error and the measurement errors described above occur. In addition, an error caused by electrostatic discharge (ESD) noise may occur. Accordingly, it is determined that the micro short circuit occurs if the (SOC-I)–(SOC-V) is higher than a predetermined value (positive value) and it is determined that the micro short circuit does not occur if (SOC-I)–(SOC-V) is lower than or equal to the predetermined value (positive value).

Since the gap between the SOC-I and the SOC-V is increased as the elapsed time since the activation is lengthened, the accuracy of the determination of whether the micro short circuit occurs is improved while the timing when the micro short circuit is detected is late. The designer is capable of adjusting the accuracy of the determination of whether the micro short circuit occurs and the timing when the micro short circuit is detected by adjusting the predetermined value and/or the determination timing (the elapsed time since the activation).

As illustrated in FIG. 5 and FIG. 6, when the micro short circuit occurs in the cell S1, the gap between the SOC-I and the SOC-V is increased with time. Accordingly, in comparison between the gap between the SOC-I and the SOC-V at a first time with the gap between the SOC-I and the SOC-V at a second time, it is determined that the micro short circuit occurs if the gap is increased and it is determined that the micro short circuit does not occur if the gap is not increased. Here, the first time is a time previous to the second time and the first time includes the time of activation.

Figure 7:
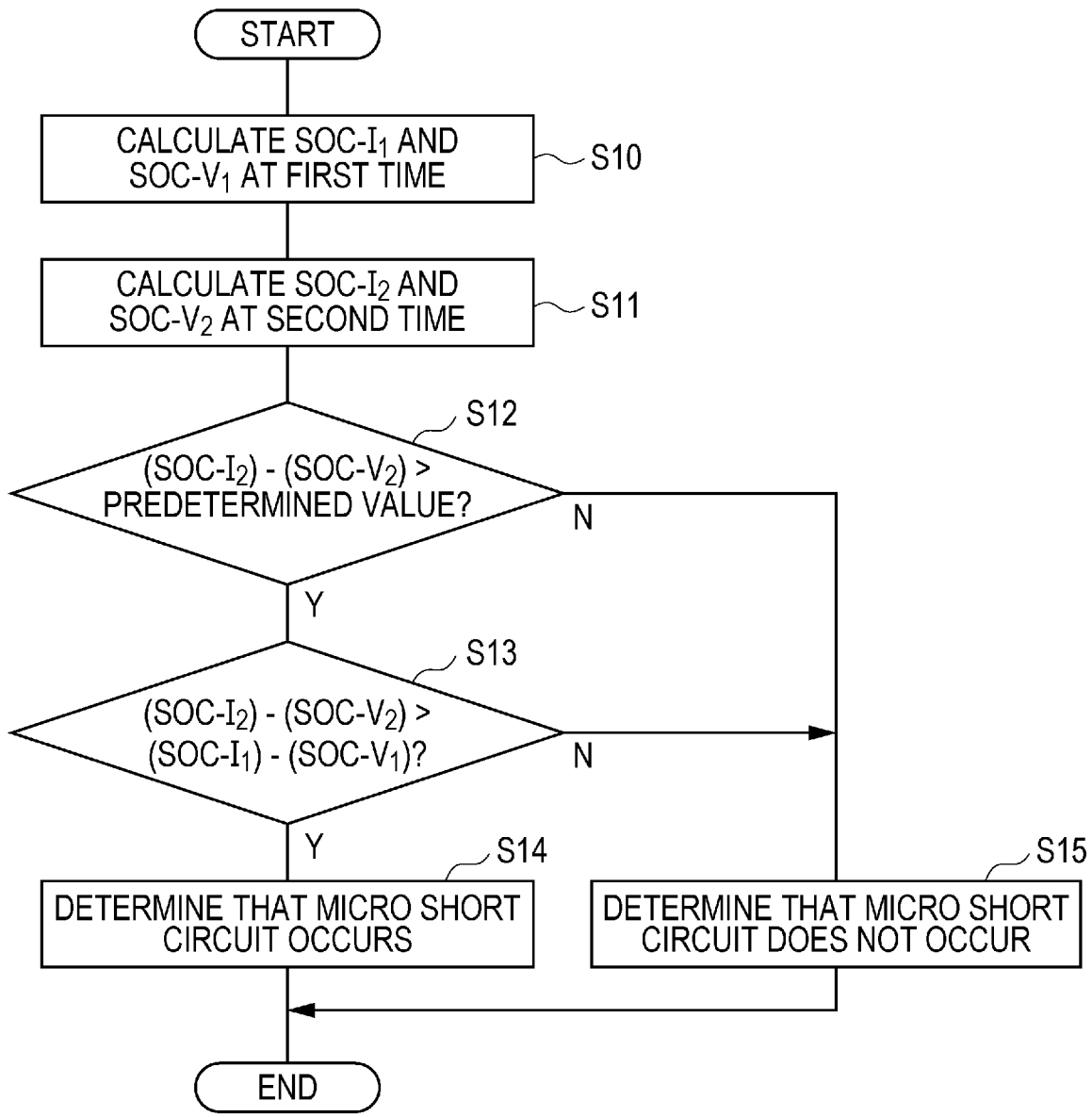
FIG. 7 is a flowchart illustrating an exemplary process for determining whether the micro short circuit occurs in the cell.

FIG. 7 is a flowchart illustrating an exemplary process for determining whether the micro short circuit occurs in the cell S1. The control unit 13 calculates SOC-$I_1$ and SOC-$V_1$ at the first time (S10). The calculated SOC-$I_1$ and the SOC-$V_1$ are temporarily stored in a working area. The control unit 13 calculates SOC-$I_2$ and SOC-$V_2$ at the second time (S11).

The control unit 13 determines whether the difference value calculated by subtracting the SOC-$V_2$ from the SOC-$I_2$ is higher than a predetermined value (positive value) (S12). If the difference value is lower than or equal to the predetermined value (N in S12), the control unit 13 determines that the micro short circuit does not occur (S15). If the difference value is higher than the predetermined value (Y in S12), the control unit 13 determines whether a second difference value calculated by subtracting the SOC-$V_2$ from the SOC-$I_2$ is higher than a first difference value calculated by subtracting the SOC-$V_1$ from the SOC-$I_1$ (S13). If the second difference value is higher than the first difference value (Y in S13), the control unit 13 determines that the micro short circuit occurs (S14). If the second difference value is lower than or equal to the first difference value (N in S13), the control unit 13 determines that the micro short circuit does not occur (S15).

Although a step of determining whether the first difference value calculated by subtracting the SOC-$V_1$ from the SOC-$I_1$ is higher than the predetermined value (positive value) is omitted in Step S12, the determination through comparison may be added when the first time is a time other than the time of activation. In this case, the control unit 13 determines that the micro short circuit does not occur (S15) if at least one of the first difference value calculated by subtracting the SOC-$V_1$ from the SOC-$I_1$ and the second difference value calculated by subtracting the SOC-$V_2$ from the SOC-$I_2$ is lower than or equal to the predetermined value. The process goes to Step S13 if both the first difference value and the second difference value are higher than the predetermined value.

Although the example is indicated in FIG. 6 in which the SOC of the cell S1 is monotonically decreased during the discharge, practically, the discharge current is often irregularly varied due to the variation in the load 2. In such a case, the decrease curve of the SOC is also irregularly varied. In contrast, the SOC of the cell S1 often monotonically increased during the charge. The inverter (not illustrated) between the load 2 and the cell S1 often normally charges the cell S1 with constant current (CC) at a predetermined charge rate.

The accuracy of the process of determining whether the micro short circuit occurs is increased when the SOC is monotonically varied, compared with the case in which the SOC is irregularly varied. Accordingly, the determination process is preferably performed during the charge. For example, the determination process is preferably performed at a time between a time t0 and a time t1 in FIG. 5, a time between the time t1 and a time t2 in FIG. 5, or a time between a time t2 and a time t3 in FIG. 6.

Although the simple power storage system 1 including one cell S1 is described above, a case practically frequently occurs in which many cells are connected in series or in parallel to each other to form a power storage unit with high capacity and high voltage. In particular, the large-scale power storage system 1 is configured in the in-vehicle use, the power storage use, and the FR use.

Figure 8:
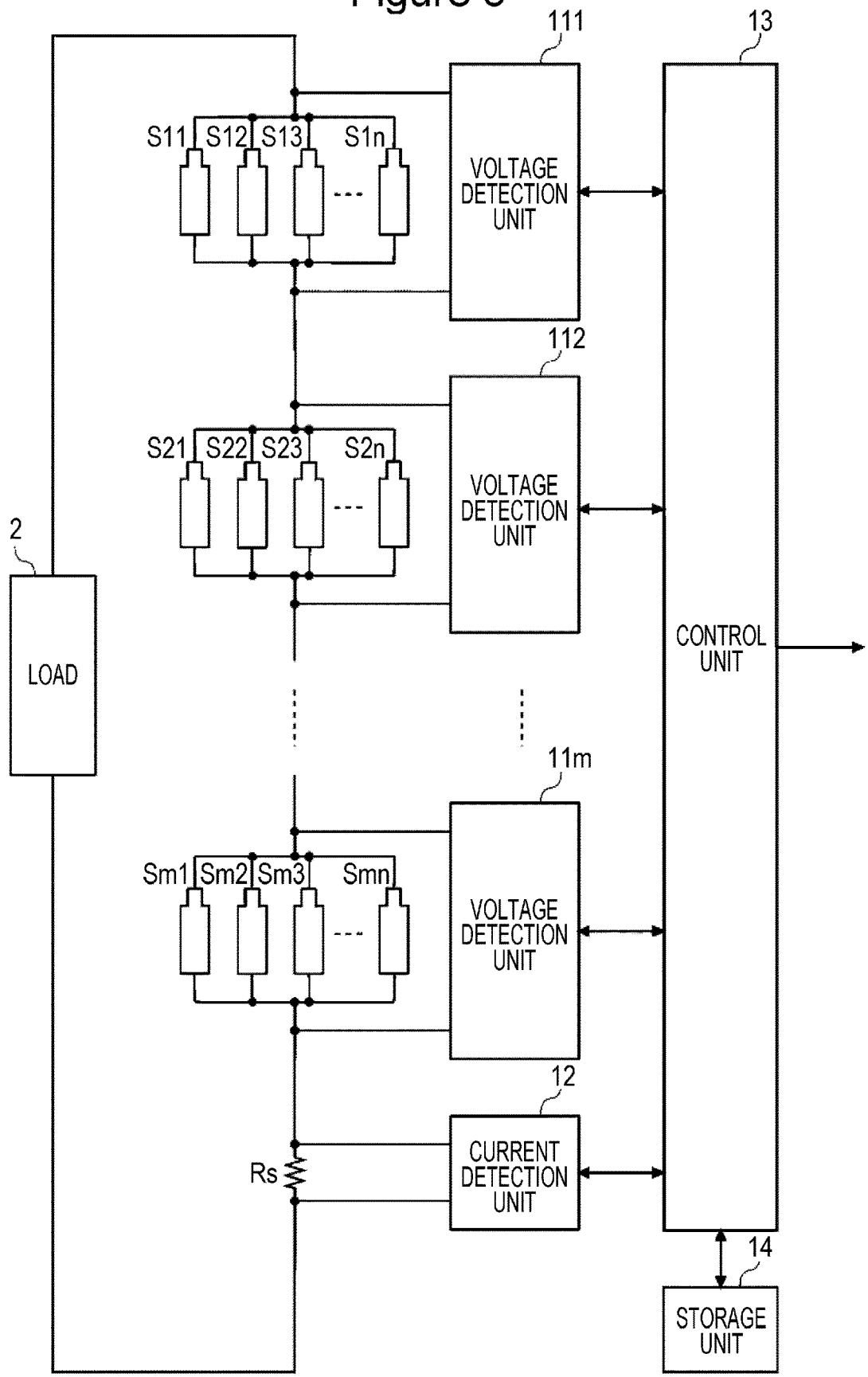
FIG. 8 is a diagram illustrating another exemplary configuration of the power storage system according to the embodiment of the present invention.

FIG. 8 is a diagram illustrating another exemplary configuration of the power storage system 1 according to the embodiment of the present invention. In FIG. 8, multiple cells S11 to S1n are connected in parallel to each other to compose one assembly battery and m-number assembly batteries are connected in series to each other to form a battery pack. Voltage detection units 111 to 11m are provided for the respective m-number assembly batteries and the voltage detection units 111 to 11m respectively supply the detected voltages to the control unit 13. The control unit 13 determines whether the micro short circuit occurs for each assembly battery. Comparison of voltage between different assembly batteries is not basically performed in the process of determining whether the micro short circuit occurs. The SOC-I is compared with the SOC-V in each assembly battery to determine whether the micro short circuit occurs in each assembly battery.

As described above, according to the present embodiment, it is possible to determine whether the micro short circuit occurs with high accuracy through the comparison between the SOC-I and the SOC-V. In addition, it is not necessary to perform the comparison of voltage between the multiple cells or between the multiple assembly batteries. Accordingly, even if the multiple cells or the multiple assembly batteries are varied in the level of deterioration, it is possible to accurately determine whether the micro short circuit occurs without being affected by the variation in the level of deterioration. Consequently, it is possible to accurately determine whether the micro short circuit occurs in each battery even in the power storage system in which new batteries and old batteries are mixed. As a result, the maintenance performance of the power storage system is greatly improved.

The present invention is described above based on the embodiment. The embodiment is only an example and it will be understood by those skilled in the art that various modifications are available in combination of the respective components and the respective processes and that such modifications are within the scope of the present invention.

The example is described in the above embodiment in which it is determined whether the difference exists between the SOC-I and the SOC-V based on the SOC-Is and the SOC-Vs of the two points: the first time and the second time. It may be determined whether the difference exists between the SOC-I and the SOC-V based on three or more SOC-Is and SOC-Vs. In this case, the accuracy of the determination is further improved.

The embodiment may be identified by the following items.

[Item 1]

A management apparatus (10) includes a voltage detection unit (11) that detects voltage between both ends of a power storage unit (S1), a current detection unit (12) that detects current flowing through the power storage unit (S1), and a control unit (13) that estimates a state of charge (SOC) of the power storage unit (S1) using an open circuit voltage (OCV) method based on the voltage detected by the voltage detection unit (11), estimates the SOC of the power storage unit (S1) using a current integration method based on the current detected by the current detection unit (12), and compares the SOC estimated using the OCV method with the SOC estimated using the current integration method to determine whether micro short circuit occurs in the power storage unit (S1).

With the above configuration, it is possible to determine whether the micro short circuit occurs in the power storage unit (S1) with high accuracy.

[Item 2]

In the management apparatus (10) described in Item 1, the control unit (13) determines that the micro short circuit occurs in the power storage unit (S1) if a difference between the SOC estimated using the OCV method and the SOC estimated using the current integration method after a predetermined time period since activation of the power storage unit (S1) is started is greater than or equal to a predetermined value.

With the above configuration, it is possible to determine whether the micro short circuit occurs in the power storage unit (S1) based on the difference between the SOC estimated using the OCV method and the SOC estimated using the current integration method, which is caused with time.

[Item 3]

In the management apparatus (10) described in Item 1, the control unit (13) determines that the micro short circuit occurs in the power storage unit if a difference between the SOC estimated using the OCV method and the SOC estimated using the current integration method at a second time is increased from the difference at a first time, the second time being behind the first time by a predetermined time.

With the above configuration, it is possible to determine whether the micro short circuit occurs in the power storage unit (S1) with higher accuracy.

[Item 4]

In the management apparatus (10) described in any of Items 1 to 3, the control unit (13) performs the process of determining whether the micro short circuit occurs in the power storage unit (S1) during charge of the power storage unit (S1).

With the above configuration, it is possible to determine whether the micro short circuit occurs in the power storage unit (S1) based on stable measured values.

[Item 5]

A power storage system (1) includes a power storage unit (S1), and the management apparatus (10) described in any of Items 1 to 4.

With the above configuration, it is possible to determine whether the micro short circuit occurs in the power storage unit (S1) in the power storage system (1) with high accuracy.

INDUSTRIAL APPLICABILITY

The present invention is available in a management apparatus and a power storage system.

REFERENCE SIGNS LIST 1 power storage system
2 load
S1 cell
R1 internal resistance
R2 micro short circuit resistance
E electromotive force unit
Rs shunt resistor
10 management apparatus
11 voltage detection unit
12 current detection unit
13 control unit
14 storage unit
14*a* OCV-SOC table
14*b* internal resistance table

The invention claimed is:

1. A management apparatus comprising:
 a voltage detection unit that detects voltage between both ends of a power storage unit;
 a current detection unit that detects current flowing through the power storage unit; and
 a control unit that estimates a state of charge (SOC) of the power storage unit using an open circuit voltage (OCV) method based on the voltage detected by the voltage detection unit, estimates the SOC of the power storage unit using a current integration method based on the current detected by the current detection unit, and compares the SOC estimated using the OCV method with the SOC estimated using the current integration method to determine whether micro short circuit occurs in the power storage unit,
 wherein the control unit determines that the micro short circuit occurs in the power storage unit if a difference between the SOC estimated using the OCV method and the SOC estimated using the current integration method at a second time is increased from the difference at a first time, the second time being behind the first time by a predetermined time.

2. The management apparatus according to claim 1,
 wherein the control unit performs the process of determining whether the micro short circuit occurs in the power storage unit during charge of the power storage unit.

3. A power storage system comprising:
 a power storage unit; and
 the management apparatus according to claim 1.

4. A power storage system comprising:
 a power storage unit; and
 the management apparatus according to claim 2.

* * * * *